(12) United States Patent
O et al.

(10) Patent No.: US 11,355,181 B2
(45) Date of Patent: *Jun. 7, 2022

(54) HIGH BANDWIDTH MEMORY AND SYSTEM HAVING THE SAME

(71) Applicant: SAMSUNG ELECTRONICS CO., LTD., Suwon-si (KR)

(72) Inventors: Seongil O, Suwon-si (KR); Namsung Kim, Yongin-si (KR); Sukhan Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/333,366

(22) Filed: May 28, 2021

(65) Prior Publication Data

US 2021/0287735 A1 Sep. 16, 2021

Related U.S. Application Data

(63) Continuation of application No. 16/925,049, filed on Jul. 9, 2020, now Pat. No. 11,069,400.

(30) Foreign Application Priority Data

Jan. 20, 2020 (KR) .......................... 10-2020-0007177

(51) Int. Cl.
*G11C 7/10* (2006.01)
*G11C 11/4096* (2006.01)
(Continued)

(52) U.S. Cl.
CPC ........ *G11C 11/4096* (2013.01); *G06F 9/3001* (2013.01); *G06F 9/30101* (2013.01);
(Continued)

(58) Field of Classification Search
CPC ............. G11C 11/4096; G11C 7/1045; G11C 11/4082; G11C 11/4085; G11C 11/4091;
(Continued)

(56) References Cited

U.S. PATENT DOCUMENTS

| 7,562,271 | B2 | 7/2009 | Shaeffer et al. |
| 9,432,298 | B1 * | 8/2016 | Smith ................ H04L 49/9057 |

(Continued)

FOREIGN PATENT DOCUMENTS

| CN | 112397108 A | * | 2/2021 | ........... G11C 11/408 |
| CN | 113138956 A | * | 7/2021 | ......... G06F 12/0895 |

(Continued)

*Primary Examiner* — Viet Q Nguyen
(74) *Attorney, Agent, or Firm* — Sughrue Mion, PLLC

(57) ABSTRACT

A high bandwidth memory and a system having the same are disclosed. The high bandwidth memory includes a buffer die and a plurality of memory dies, each of which includes at least one first processing element bank group and at least one second processing element bank group. The at least one first processing element bank group includes one or more first banks connected to one or more first bank input/output line groups, and a first processing element controller connected to the one or more first bank input/output line groups and a first global input/output line group, and is configured to perform a first processing operation on first data output from one of the one or more first bank input/output line groups and second data transmitted through the first global input/output line group based on a first instruction that is generated based on a first processing command.

20 Claims, 18 Drawing Sheets

(51) Int. Cl.
*G11C 11/4091* (2006.01)
*G11C 11/408* (2006.01)
*G06F 9/30* (2018.01)
*G06F 9/38* (2018.01)

(52) U.S. Cl.
CPC .......... *G06F 9/3893* (2013.01); *G11C 7/1045* (2013.01); *G11C 11/4082* (2013.01); *G11C 11/4085* (2013.01); *G11C 11/4091* (2013.01)

(58) Field of Classification Search
CPC ... G06F 9/3001; G06F 9/30101; G06F 9/3893
USPC .................................................. 365/189.05
See application file for complete search history.

(56) References Cited

U.S. PATENT DOCUMENTS

| | | | |
|---|---|---|---|
| 9,477,636 B2 | 10/2016 | Walker et al. | |
| 9,535,876 B2 | 1/2017 | Walker | |
| 9,721,644 B2 | 8/2017 | Kim et al. | |
| 10,049,721 B1 | 8/2018 | Lea et al. | |
| 10,416,896 B2 | 9/2019 | O et al. | |
| 10,559,550 B2 * | 2/2020 | Lee | G11C 11/4076 |
| 10,628,295 B2 | 4/2020 | Gu et al. | |
| 10,635,535 B2 | 4/2020 | Cha et al. | |
| 10,642,612 B2 | 5/2020 | Kim | |
| 10,706,953 B2 | 7/2020 | Cho et al. | |
| 10,866,900 B2 | 12/2020 | Chang et al. | |
| 10,957,380 B2 | 3/2021 | Shin et al. | |
| 11,069,400 B1 * | 7/2021 | O | G11C 11/4096 |
| 2010/0325386 A1 | 12/2010 | Sueyoshi et al. | |
| 2014/0192583 A1 | 7/2014 | Rajan et al. | |
| 2017/0263306 A1 | 9/2017 | Murphy | |
| 2017/0364469 A1 | 12/2017 | Crisp | |
| 2019/0096453 A1 | 3/2019 | Shin et al. | |
| 2019/0227981 A1 | 7/2019 | Tomishima et al. | |
| 2020/0293319 A1 * | 9/2020 | Lee | G06F 9/30145 |
| 2021/0026557 A1 * | 1/2021 | Cariello | G06F 3/0659 |

FOREIGN PATENT DOCUMENTS

| | | | | |
|---|---|---|---|---|
| CN | 113140236 A | * | 7/2021 | ......... G11C 11/4096 |
| JP | 2019061677 A | * | 4/2019 | ........... G11C 7/1006 |
| KR | 20210092078 A | * | 7/2021 | ........... G06F 3/0604 |

* cited by examiner

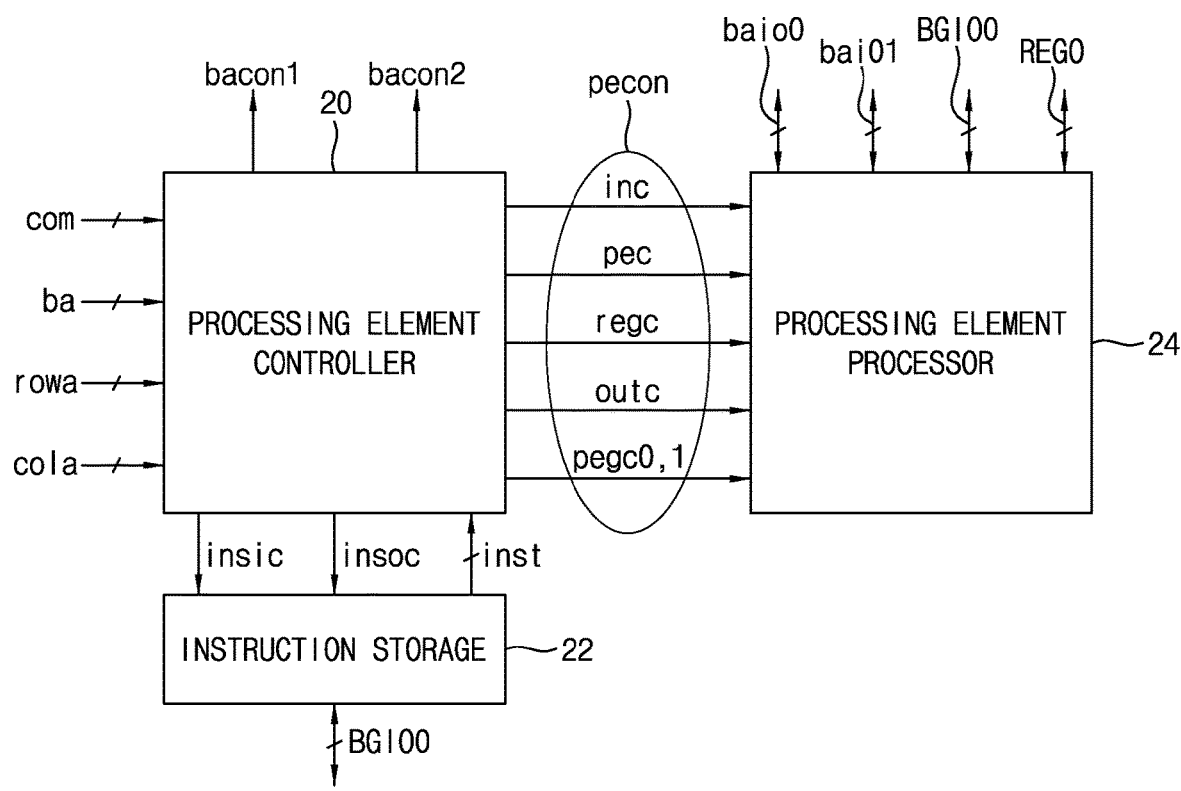

FIG. 10A

| INDEX | OPE | DST | SRC1 | SRC2 | SRC3 | MASK |
|---|---|---|---|---|---|---|

FIG. 10B

| MASK | FUNCTION |
|---|---|
| 0000 | PE0~PE7 |
| 1000 | PE0 |
| ⋮ | ⋮ |
| 1111 | PE7 |

FIG. 11

| PEEN | RESET | PCNT | ⋯ |
|---|---|---|---|

| REG0 | REG1 | . . . | REGx |

FIG. 14A

| TERMINAL | CK | CKE | | R0 | R1 | ... | Ri |
|---|---|---|---|---|---|---|---|
| | | (n-1) | n | | | | |
| 1 | ⌐ | H | H | | | | |
| 2 | ⌐ | | | | | | |
| 3 | ⌐ | | | | | | |
| 4 | ⌐ | | | | | | |

FIG. 14B

| TERMINAL | CK | CKE | | C0 | C1 | C2 | C3 | ... | cj |
|---|---|---|---|---|---|---|---|---|---|
| | | (n-1) | n | | | | | | |
| 1 | ⌐ | H | H | | | | | | |
| 2 | ⌐ | | | | | | | | |

FIG. 15

| BANK ADDRESS | DESCRIPTION |
|---|---|
| 0 0 0 0 | PE0 |
| 0 0 0 1 | BA0,BA2,···BA14,PE0~PE7 |
| 0 0 1 0 | PE1 |
| 0 0 1 1 | BA1,BA3,···BA15,PE0~PE7 |
| 0 1 0 0 | PE2 |
| 0 1 0 1 | |
| 0 1 1 0 | PE3 |
| 0 1 1 1 | |
| 1 0 0 0 | PE4 |
| 1 0 0 1 | |
| 1 0 1 0 | PE5 |
| 1 0 1 1 | |
| 1 1 0 0 | PE6 |
| 1 1 0 1 | |
| 1 1 1 0 | PE7 |
| 1 1 1 1 | BA0~BA15,PE0~PE7 |

$$A = \begin{pmatrix} D11 & D12 & \cdots & D116 \\ D21 & D22 & \cdots & D216 \\ & & \vdots & \\ D71 & D72 & \cdots & D716 \end{pmatrix} \times B = \begin{pmatrix} V11 \\ V21 \\ \vdots \\ V161 \end{pmatrix} = C = \begin{pmatrix} O11 \\ O21 \\ \vdots \\ O71 \end{pmatrix}$$

FIG. 19A

| INDEX | OPE | DST | SRC1 | SRC2 | SRC3 | MASK |
|---|---|---|---|---|---|---|
| 0 | MOV | BGI0 | IOSA | | | 0000 |
| 1 | MOV | BGI0 | IOSA | | | 0000 |
| . | . | . | . | | | . |
| 7 | MOV | BGI0 | IOSA | | | 0000 |
| 8 | JUMP | 0 | 1 | | | 0000 |
| 9 | NOP | | | | | 1000 |
| . | . | . | . | | | . |
| 15 | NOP | | | | | 1111 |

FIG. 19B

| INDEX | OPE | DST | SRC1 | SRC2 | SRC3 | MASK |
|---|---|---|---|---|---|---|
| 0 | MAC | REG0 | IOSA | BGI0 | REG0 | 0000 |
| 1 | MAC | REG0 | IOSA | BGI0 | REG0 | 0000 |
| . | . | . | . | . | . | . |
| 7 | MAC | REG0 | IOSA | BGI0 | REG0 | 0000 |
| 8 | JUMP | 0 | 1 | | | 0000 |
| 9 | MOV | BGI0 | REG0 | | | 1000 |
| . | . | . | . | | | . |
| 15 | MOV | BGI0 | REG0 | | | 1111 |

FIG. 21

| BG0 (PEBG0) | BA0 | BA4 | BG1 (PEBG1) |
|---|---|---|---|
| | BA1 | BA5 | |
| | BA2 | BA6 | |
| | BA3 | BA7 | |
| | PE0 | PE1 | |

| BG2 (PEBG2) | PE2 | PE3 | BG3 (PEBG3) |
|---|---|---|---|
| | BA8 | BA12 | |
| | BA9 | BA13 | |
| | BA10 | BA14 | |
| | BA11 | BA15 | |

HIGH BANDWIDTH MEMORY AND SYSTEM HAVING THE SAME

This a Continuation Application of U.S. application Ser. No. 16/925,049 filed on Jul. 9, 2020, now U.S. Pat. No. 11,069,400, issued Jul. 20, 2021, which claims priority from Korean Patent Application No. 10-2020-0007177, filed on Jan. 20, 2020, in the Korean Intellectual Property Office, the disclosure of which is incorporated herein by reference in its entirety.

BACKGROUND

1. Field

Methods and apparatuses consistent with example embodiments relate to a high bandwidth memory and a system having the same.

2. Description of Related Art

A high bandwidth memory (HBM) may include a logic die, and a plurality of memory dies stacked on the logic die. A system having the high bandwidth memory may include the high bandwidth memory and a control unit (for example, a Central Processing Unit (CPU) or a Graphic Processing Unit (GPU)). In general, the high bandwidth memory may store data under the control of the control unit, and the control unit may perform a processing operation for the data.

SUMMARY

One or more example embodiments provide a high bandwidth memory which is capable of internally performing different processing operations simultaneously using data stored therein and a system having the same.

Example embodiments are not limited to the aforementioned object, and other unmentioned objects will be clearly understood by those skilled in the art based on the following description.

A high bandwidth memory in accordance with an example embodiment includes a buffer die; and a plurality of memory dies stacked on the buffer die. Each of the plurality of memory dies includes at least one first processing element bank group and at least one second processing element bank group. The at least one first processing element bank group includes: one or more first banks connected to one or more first bank input/output line groups; and a first processing element controller connected to the one or more first bank input/output line groups and a first global input/output line group, wherein the first processing element controller is configured to perform a first processing operation on first data output from one of the one or more first bank input/output line groups and second data transmitted through the first global input/output line group based on a first instruction that is generated based on a first processing command. The at least one second processing element bank group includes: one or more second banks connected to one or more second bank input/output line groups; and a second processing element controller connected to the one or more second bank input/output line groups and a second global input/output line group, wherein the second processing element controller is configured to perform a second processing operation of obtaining the second data from one of the one or more second banks and transmitting the second data to the second global input/output line group based on a second instruction different from the first instruction that is generated based on the first processing command. The first global input/output line group and the second global input/output line group are connected in common to a data bus.

A high bandwidth memory in accordance with an example embodiment includes a buffer die; and a plurality of memory dies stacked on the buffer die. Each of the plurality of memory dies includes at least one first processing element bank group and at least one second processing element bank group. The at least one first processing element bank group includes: one or more first banks connected to one or more first bank input/output line groups connected to a first global input/output line group; and a first processing element controller connected to the first global input/output line group and a data bus, wherein the first processing element controller is configured to, based on a first instruction received based on a first processing command, receive first data output through one of the one or more first bank input/output line groups, receive second data through the data bus and perform a first processing operation on the first data and the second data. The at least one second processing element bank group includes: one or more second banks connected to one or more second bank input/output line groups connected to a second global input/output line group; and a second processing element controller connected to the second global input/output line group and the data bus, wherein the second processing element controller is configured to perform a second processing operation of obtaining the second data from one of the one or more second bank input/output line groups and transmitting the second data to the data bus through the second global input/output line group based on a second instruction different from the first instruction, the second instruction being received based on the first processing command.

A system in accordance with an example embodiment includes a high bandwidth memory including a buffer die, and a plurality of memory dies stacked on the buffer die; and a controller configured to transmit a command & address to the buffer die and receive output data from the buffer die. Each of the plurality of memory dies includes at least one first processing element bank group and at least one second processing element bank group. The at least one first processing element bank group includes: one or more first banks connected to one or more first bank input/output line groups; and a first processing element controller connected to the one or more first bank input/output line groups and a first global input/output line group, wherein the first processing element controller is configured to perform a first processing operation on first data output from one of the one or more first bank input/output line groups and second data transmitted through the first global input/output line group based on a first instruction that is generated based on a first processing command. The at least one second processing element bank group includes: one or more second banks connected to one or more second bank input/output line groups; and a second processing element controller connected to the one or more second bank input/output line groups and a second global input/output line group, wherein the second processing element controller is configured to perform a second processing operation of retrieving the second data from one of the one or more second banks and transmitting the second data to the second global input/output line group based on a second instruction different from the first instruction that is generated based on the first processing command. The first global input/output line group and the second global input/output line group are connected in common to a data bus.

BRIEF DESCRIPTION OF THE DRAWINGS

The above and other objects and features will become apparent from the following description of example embodiments with reference to the accompanying drawings in which:

FIG. 8 is a block diagram showing a configuration of a processing element unit according to an example embodiment.

FIG. 9 is a view showing a structure of an instruction storage according to an example embodiment.

FIGS. 10A and 10B show a format of an instruction stored in an instruction storage area of an instruction storage according to an example embodiment.

FIG. 11 shows configuration information stored in a configuration information storage area of an instruction storage according to an example embodiment.

FIGS. 14A and 14B show processing command truth tables of an HBM according to an example embodiment.

FIG. 15 is a table showing banks and/or processing element controllers designated by a bank address applied together with a processing command according to an example embodiment.

FIG. 16 is a timing diagram illustrating a processing setting operation of an HBM according to an example embodiment.

FIGS. 17, 18, 19A, 19B and 20 are views illustrating a processing operation of an HBM according to an example embodiment.

FIG. 21 is a view showing configurations of bank groups of a pseudo-memory channel according to an example embodiment.

DETAILED DESCRIPTION

The above and other aspects and features will become more apparent by describing in detail example embodiments with reference to the accompanying drawings. It will be understood that when an element or layer is referred to as being "over," "above," "on," "connected to" or "coupled to" another element or layer, it can be directly over, above, on, connected or coupled to the other element or layer or intervening elements or layers may be present. In contrast, when an element is referred to as being "directly over," "directly above," "directly on," "directly connected to" or "directly coupled to" another element or layer, there are no intervening elements or layers present. Like numerals refer to like elements throughout.

Figure 1:
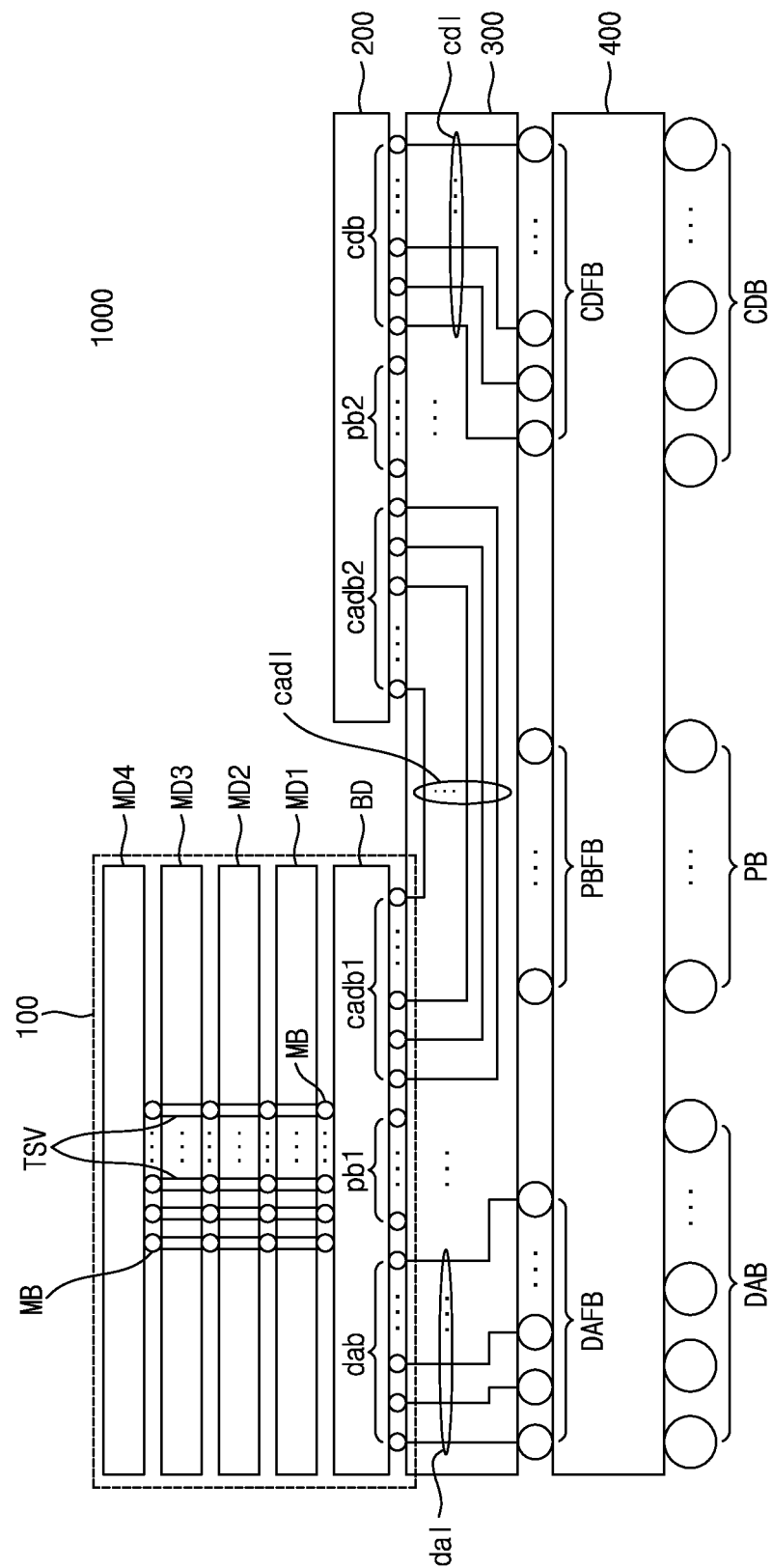
FIG. 1 is a view showing a structure of a system having an HBM, more particularly a system manufactured with a 2.5-Dimension (D) package, according to an example embodiment.

FIG. 1 is a view showing the structure of a system having an HBM, more particularly a system manufactured with a 2.5-Dimension (D) package, according to an example embodiment.

Referring to FIG. 1, a system 1000 may include an HBM 100, a control unit 200, an interposer 300, and a Printed Circuit Board (PCB) 400. The HBM 100 may include memory dies MD1 to MD4 and a buffer die BD.

The HBM 100 may include the memory dies MD1 to MD4 and the buffer die BD. The memory dies MD1 to MD4 and the buffer die BD may be stacked, and the stacked memory dies MD1 to MD4 may be placed on the buffer die BD. First bumps MB may be formed between the dies MD1 to MD4 and BD, and Through Silicon Vias (TSVs) passing through the memory dies MD1 to MD4 may be formed between the first bumps MB. First Direct Access (DA) bumps dab, first power bumps pb1, and first command, address and data bumps cadb1 may be arranged on a lower surface of the buffer die BD.

Second command, address and data bumps cadb2, second power bumps pb2 and first control signal and data bumps cdb may be arranged on a lower surface of the control unit 200. The control unit 200 may be a Graphic Processing Unit (GPU) die, a Central Processing Unit (CPU) die, or a System on Chip (SoC) die.

The first bumps MB, the first DA bumps dab, the first and second power bumps pb1 and pb2, the first and second command, address and data bumps cadb1 and cadb2 and the first control signal and data bumps cdb may be micro bumps.

Second DA bumps DAFB, third power bumps PBFB and second control signal and data bumps CDFB may be arranged on a lower surface of the interposer 300. The interposer 300 may include DA lines dal connecting the first DA bumps dab and the second DA bumps DAFB, command, address and data lines cad1 connecting the first command, address and data bumps cadb1 and the second command, address and data bumps cadb2, and control signal and data lines cdl connecting the first control signal and data bumps cdb and the second control signal and data bumps CDFB. Interposer 300 may further include power lines connecting the first power bumps pb1 and the third power bumps PBFB and connecting the second power bumps pb2 and the third power bumps PBFB. The second DA bumps DAFB, the third power bumps PBFB and the second control signal and data bumps CDFB may be flip die bumps.

DA balls DAB, power balls PB and control signal and data balls CDB may be disposed at a lower surface of the PCB 400. In the PCB 400, the second DA bumps DAFB and the DA balls DAB may be connected, the third power bumps PBFB and the power balls PB may be connected, and the second control signal and data bumps CDFB and the control signal and data balls CDB may be connected.

Figure 2:
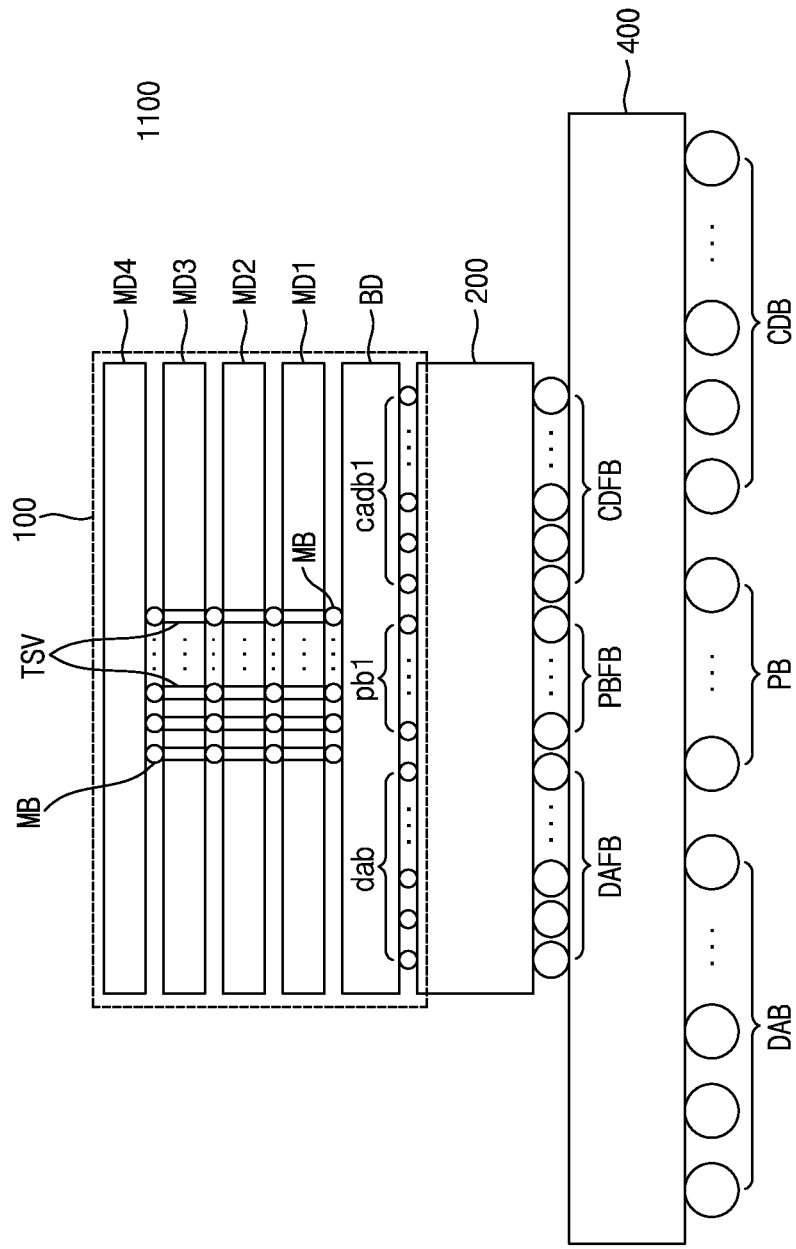
FIG. 2 is a view showing a structure of a system having an HBM, more particularly a system manufactured with a 3D package, according to an example embodiment.

FIG. 2 is a view showing the structure of a system having an HBM, more particularly a system manufactured with a 3D package, according to an example embodiment.

Referring to FIG. 2, unlike in FIG. 1, a system 1100 may not include an interposer 300. In addition, a buffer die BD of an HBM 100 may be directly arranged on an upper surface of a control unit 200. That is, first DA bumps dab, first power bumps pb1 and first command, address and data bumps cadb1 may be arranged on the upper surface of the control unit 200.

The first DA bumps dab and second DA bumps DAFB may be connected in the control unit 200. The first power bumps pb1 and third power bumps PBFB may be connected in the control unit 200.

The control unit 200 may receive a control signal and data applied through second control signal and data bumps CDFB and transmit channel command, addresses and channel data to the first command, address and data bumps cadb1.

The control unit 200 shown in FIG. 1 and FIG. 2 may process the data in response to the control signal applied through the second control signal and data bumps CDFB, generate the processed data as the channel data and transmit the channel data with the channel command & addresses to the buffer die BD through the first command, address and data bumps cadb1.

Figure 3:
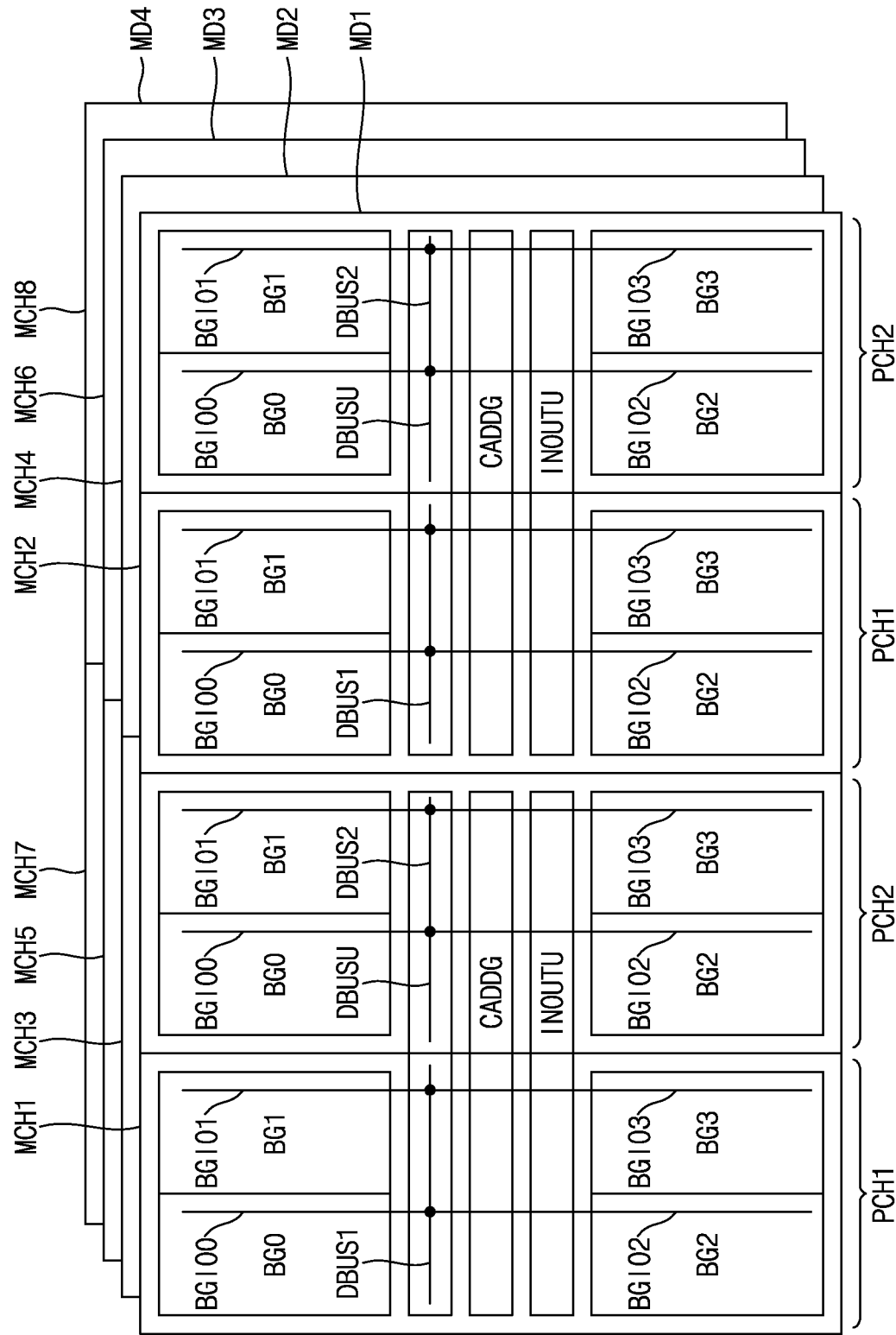
FIG. 3 is a view showing configurations of a plurality of memory dies according to an example embodiment.

FIG. 3 is a view showing the configurations of a plurality of memory dies according to an example embodiment. Memory dies MD1 to MD4 may each include two memory channels MCH1 and MCH2, MCH3 and MCH4, MCH5 and MCH6 or MCH7 and MCH8. Each of the memory channels MCH1 to MCH8 may include two pseudo-memory channels PCH1 and PCH2, an input/output unit INOUTU, a command & address generator CADDG, and a data bus unit DBUSU.

Referring to FIG. 3, each of the pseudo-memory channels PCH1 and PCH2 may include four bank groups BG0 to BG3, which may transmit data through global input/output line groups BGIO0, BGIO1, BGIO2 and BGIO3, respectively. The global line groups BGIO0 to BGIO3 of the pseudo-memory channel PCH1 may be connected to a data bus DBUS1 to transmit data, and the global input/output line groups BGIO0 to BGIO3 of the pseudo-memory channel PCH2 may be connected to a data bus DBUS2 to transmit data.

Figure 4:
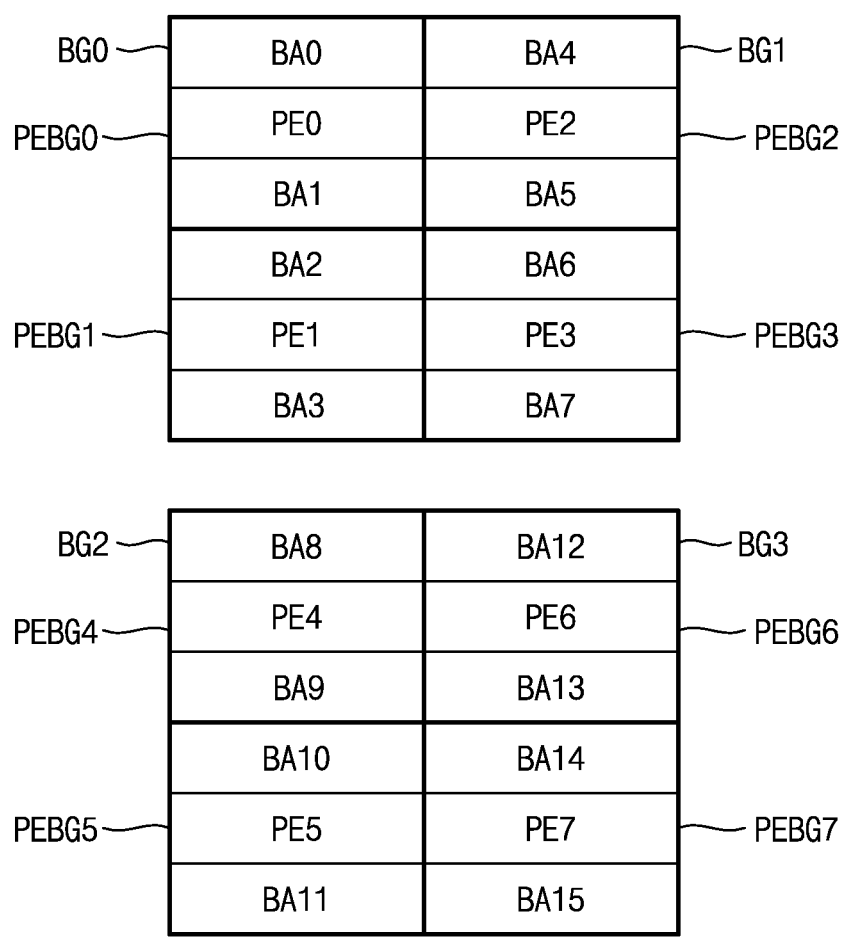
FIG. 4 is a view showing configurations of bank groups of a pseudo-memory channel according to an example embodiment.

FIG. 4 is a view showing the configurations of bank groups of a pseudo-memory channel according to an example embodiment. Bank groups BG0 to BG3 may each be configured with two processing element bank groups PEBG0 and PEBG1, PEBG2 and PEBG3, PEBG4 and PEBG5 or PEBG6 and PEBG7.

Referring to FIG. 4, the processing element bank group PEBG0 may include two banks BA0 and BA1 and a processing element controller PE0, the processing element bank group PEBG1 may include two banks BA2 and BA3 and a processing element controller PE1, the processing element bank group PEBG2 may include two banks BA4 and BA5 and a processing element controller PE2, and the processing element bank group PEBG3 may include two banks BA6 and BA7 and a processing element controller PE3. Likewise, the processing element bank group PEBG4 may include two banks BA8 and BA9 and a processing element controller PE4, the processing element bank group PEBG5 may include two banks BA10 and BA11 and a processing element controller PE5, the processing element bank group PEBG6 may include two banks BA12 and BA13 and a processing element controller PE6, and the processing element bank group PEBG7 may include two banks BA14 and BA15 and a processing element controller PE7. Each of the processing element controllers PE0 to PE7 may be arranged between the two banks.

FIG. 4 illustrates an example embodiment in which each processing element bank group includes two banks. However, example embodiments are not limited therefor. For example, each processing element bank group may include one bank according to an example embodiment.

Figure 5:
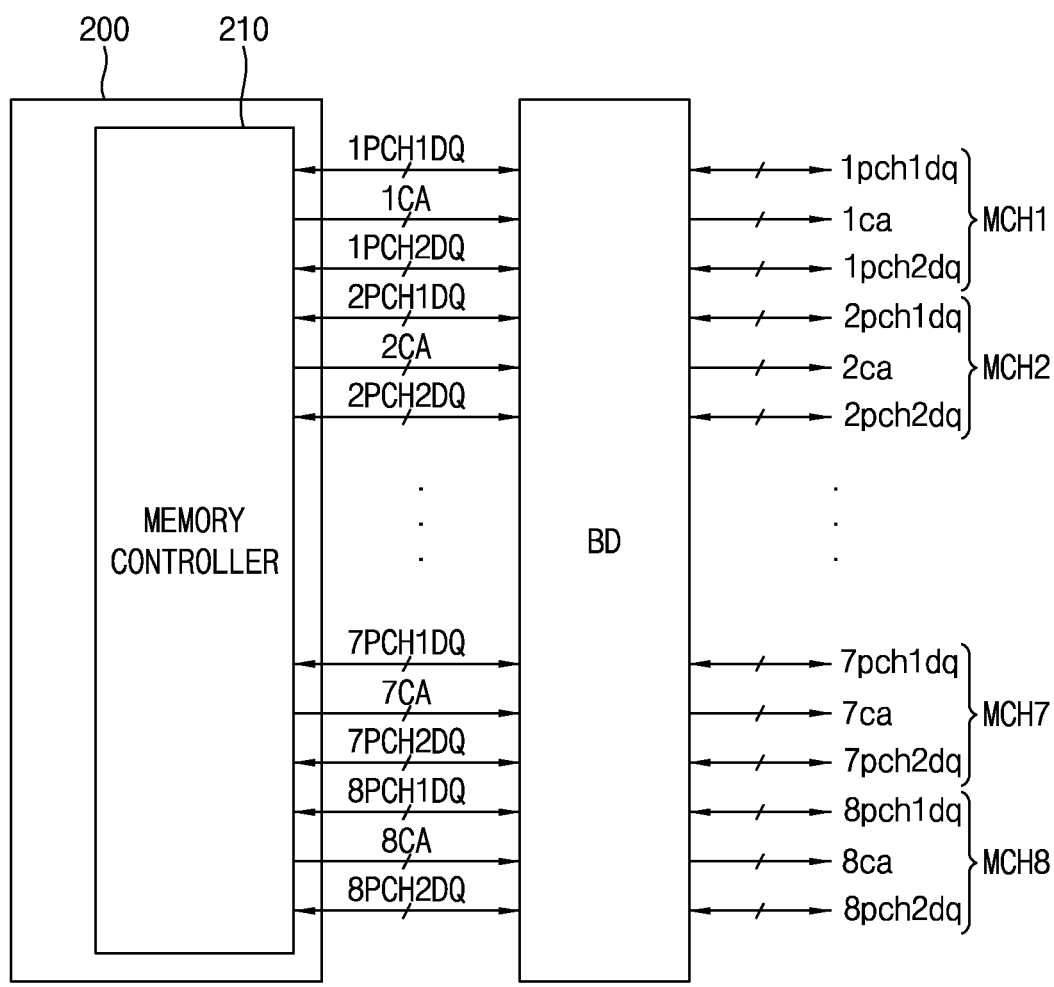
FIG. 5 is a view illustrating transmission of a command, address and data between a control unit and a buffer die according to an example embodiment.

FIG. 5 is a view illustrating transmission of a command, address and data between a control unit and a buffer die according to an example embodiment. A control unit 200 may include a memory controller 210. Buffer die BD may include an input driver and an output driver.

Referring to FIG. 5, the memory controller 210 may transmit, to the buffer die BD, a command & address 1CA for a memory channel MCH1, data 1PCH1DQ for a pseudo-memory channel PCH1 of the memory channel MCH1 and data 1PCH2DQ for a pseudo-memory channel PCH2 of the memory channel MCH1. The buffer die BD may buffer the command & address 1CA, the data 1PCH1DQ and the data 1PCH2DQ and transmit a command & address 1ca, data 1pch1dq and data 1pch2dq to the memory channel MCH1.

Likewise, the memory controller 210 may transmit, to the buffer die BD, command & addresses 2CA to 8CA for respective memory channels MCH2 to MCH8, data 2PCH1DQ to 8PCH1DQ for pseudo-memory channels PCH1 of the respective memory channels MCH2 to MCH8 and data 2PCH2DQ to 8PCH2DQ for pseudo-memory channels PCH2 of the respective memory channels MCH2 to MCH8. The buffer die BD may buffer the command & addresses 2CA to 8CA, the data 2PCH1DQ to 8PCH1DQ and the data 2PCH2DQ to 8PCH2DQ, generate command & addresses 2ca to 8ca, data 2pch1dq to 8pch1dq and data 2pch2dq to 8pch2dq and transmit the same to the memory channels MCH2 to MCH8.

Figure 6:
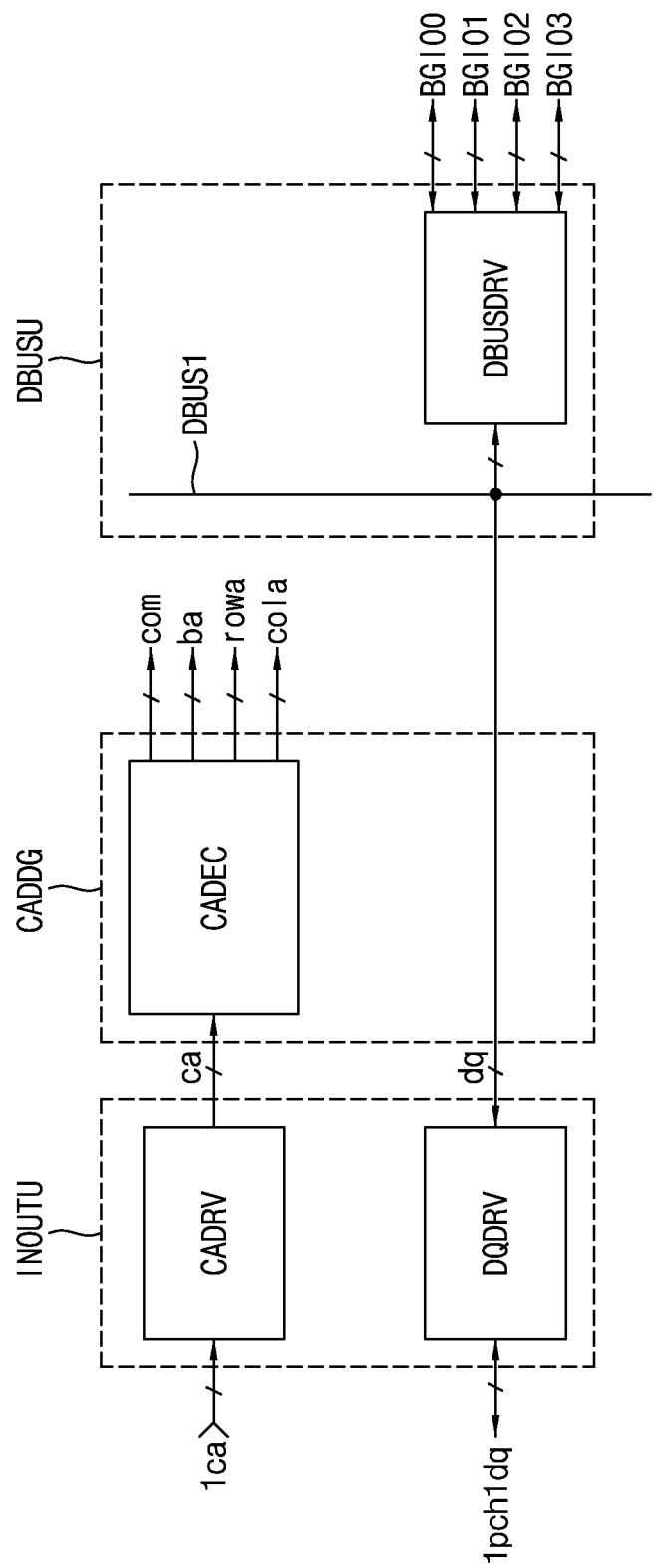
FIG. 6 is a block diagram showing configurations of an input/output unit, a command & address generator and a data bus unit, according to an example embodiment.

FIG. 6 is a block diagram showing the configurations of an input/output unit, a command & address generator and a data bus unit, more particularly an input/output unit INOUTU, a command & address generator CADDG and a data bus unit DBUSU included in a pseudo-memory channel PCH1, according to an example embodiment.

Referring to FIG. 6, the input/output unit INOUTU may include a command & address driver CADRV and a data driver DQDRV, the command & address generator CADDG may include a command & address decoder CADEC, and the data bus unit DBUSU may include a data bus driver DBUSDRV. The command & address driver CADRV and the command & address decoder CADEC may be blocks shared by a pseudo-memory channel PCH2.

A description will hereinafter be given of the function of each of the blocks shown in FIG. 6.

The command & address driver CADRV may drive a command & address 1ca to generate a command & address signal ca.

The data driver DQDRV may drive data 1pch1dq to generate data dq, and drive data dq to generate data 1pch1dq.

The command & address decoder CADEC may decode the command & address signal ca to generate a command signal com, a bank address ba, a row address rowa and a column address cola.

The data bus driver DBUSDRV may drive data transmitted between global input/output line groups BGIO0 to BGIO3 and a data bus DBUS1.

Figure 7:
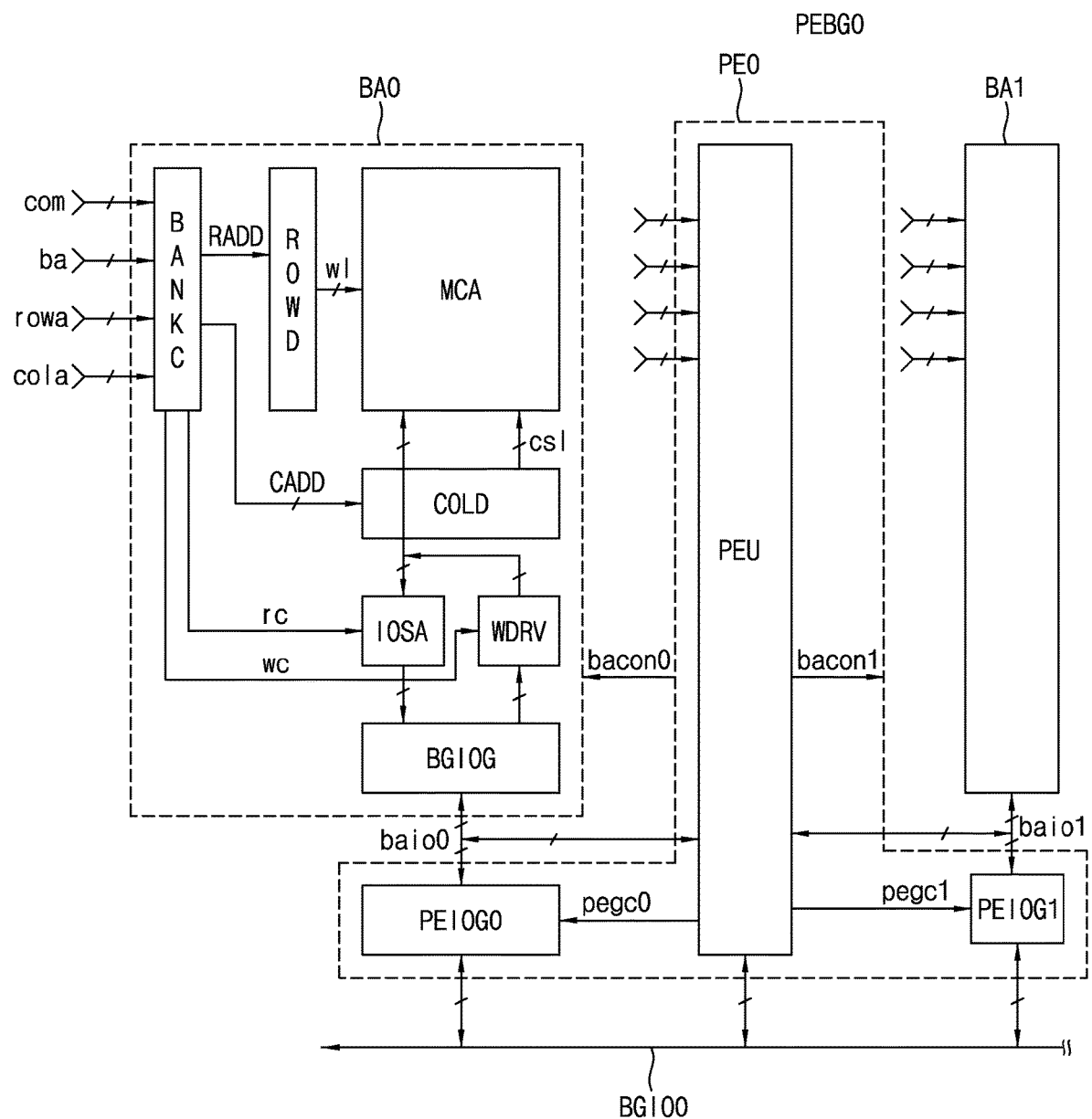
FIG. 7 is a detailed block diagram of a processing element bank group, according to an example embodiment.

FIG. 7 is a detailed block diagram of a processing element bank group, more particularly the processing element bank group PEBG0 shown in FIG. 4, according to an example embodiment.

Referring to FIG. 7, each of the banks BA0 and BA1 may include a memory cell array MCA, a bank controller BANKC, a row decoder ROWD, a column decoder COLD, an input/output sense amplifier IOSA, a write driver WDRV, and a global input/output gating unit BGIOG. The processing element controller PE0 may include a processing element unit PEU and processing element input/output gating units PEIOG0 and PEIOG1.

A description will hereinafter be given of the function of each of the blocks shown in FIG. 7.

In a normal operation, the bank controller BANKC may receive a command signal com, a bank address ba, a row address rowa and a column address cola and generate a row address signal RADD, a column address signal CADD, a write control signal wc and a read control signal rc in response to the command signal com and the bank address ba. In a processing operation, in response to a bank control signal bacon0 or bacon1, the bank controller BANKC may be disabled so as not to operate, or enabled to operate so as to generate the row address signal RADD, the column address signal CADD, the write control signal wc and the read control signal rc.

The row decoder ROWD may decode the row address signal RADD to generate a plurality of word line select signals w1, and activate at least one of the plurality of word line select signals w1.

The column decoder COLD may decode the column address signal CADD to generate a plurality of column select signals cs1, and activate at least one of the plurality of column select signals cs1.

The memory cell array MCA may include a plurality of memory cells, and may store data in selected ones of the plurality of memory cells or output data stored in the selected memory cells, in response to the plurality of word line select signals w1 and the plurality of column select signals cs1.

The input/output sense amplifier IOSA may amplify and output data output from the memory cell array MCA in response to the read control signal rc.

The write driver WDRV may drive data in response to the write control signal wc and output the data to the memory cell array MCA.

The global input/output gating unit BGIOG may transmit data output from the input/output sense amplifier IOSA to a bank input/output line group baio0 and transmit data transmitted from the bank input/output line group baio0 to the write driver WDRV.

Each of the processing element input/output gating units PEIOG0 and PEIOG1 may transmit data between the bank input/output line group baio0 or baio1 and a global input/output line group BGIO0 in the normal operation, and control transmission of data between the bank input/output line group baio0 or baio1 and the global input/output line group BGIO0 in response to a processing element input/output gating control signal pegc0 or pegc1 in the processing operation.

The processing element unit PEU may receive the command signal com, the bank address ba, the row address rowa and the column address cola and perform a processing operation based on a first instruction when the command signal com is a processing command. For example, the processing element PEU of the processing element bank groups PEBG0 may generate the processing element input/output gating control signal pegc0 to turn off the processing element input/output gating unit PEIOG0, so as to perform a first processing operation for first data transmitted through the bank input/output line group baio0 or baio1 and second data transmitted through the global input/output line group BGIO0. At the same time, the processing element unit PEU of at least one (for example, PEBG7) of the processing element bank groups PEBG1 to PEBG7 may generate the processing element input/output gating control signal pegc0 based on a second instruction different from the first instruction to turn on the processing element input/output gating unit PEIOG0, so as to transmit second data output from a bank (for example, BA14) to the global input/output line group BGIO0 through the global input/output line group BGIO3 and the data bus DBUS1.

FIG. 8 is a block diagram showing the configuration of a processing element unit according to an example embodiment. A processing element unit PEU may include a processing element controller 20, an instruction storage 22, and a processing element processor 24.

A description will hereinafter be given of the function of each of the blocks shown in FIG. 8.

The processing element controller 20 may receive a command signal com, a bank address ba, a row address rowa and a column address cola, generate an instruction input control signal insic in a processing setting operation, and, in a processing operation, generate an instruction output control signal insoc to receive an instruction inst, and decode the instruction inst to generate a processing element control signal pecon. For example, the processing element control signal pecon may include an input select signal inc, a processing element execution control signal pec, a register control signal regc, an output select signal outc, and processing element input/output gating control signals pegc0 and pegc1.

The instruction storage 22 may store data transmitted through a global input/output line group BGIO0 as an instruction in response to the instruction input control signal insic, and output the stored instruction inst to the processing element controller 20 in response to the instruction output control signal insoc.

The processing element processor 24 may perform a processing operation on at least two of data transmitted through bank input/output line groups baio0 and baio1, data transmitted through the global input/output line group BGIO0, or register output data REG0 in response to the processing element control signal pecon.

FIG. 9 is a view showing the structure of an instruction storage according to an example embodiment. An instruction storage 22 may include k storage areas INSTQ0 to INSTQk storing a plurality of instructions, and a configuration information storage area CONFG.

The instruction storage 22 may be selected by a specific row address (for example, a row address rowa whose bits are all "0"), and the k storage areas INSTQ0 to INSTQk and the configuration information storage area CONFG may be selected by a column address cola.

FIGS. 10A and 10B show the format of an instruction stored in an instruction storage area of an instruction storage according to an example embodiment.

Referring to FIG. 10A, the instruction format may include index information INDEX, operator information OPE, destination position information DST, first operand position information SRC1, second operand position information SRC2, third operand position information SRC3, and mask information MASK. The operator information OPE may be data designating a multiplication-accumulation operator MAC, a multiplication operator MUL, an addition/subtraction operator ADD/SUB, a movement operator MOV, a load operator LOAD, a store operator STORE, a jump operator JUMP, or a no operation (NOP) operator NOP. The destination position information DST may be data designating a register REG, a global input/output line group BGIO or a write driver WDRV. The first operand position information SRC1 may be data designating the input/output sense amplifier IOSA, the register REG or the global input/output line group BGIO. The second operand position information SRC2 may be data designating the register REG or the global input/output line group BGIO. The third operand position information SRC3 may be data designating the register REG. Instructions other than an instruction including the multiplication-accumulation operator MAC may not include the third operand position information SRC3. Instructions other than an instruction including the multiplication-accumulation operator MAC, the multiplication operator MUL or the addition/subtraction operator ADD/SUB may not include the second operand position information SRC2.

Referring to FIG. 10B, the mask information MASK may designate operations for all processing element controllers PE0 to PE7 when it is "0000", and designate operations for the respective processing element controllers PE0 to PE7 when it is "1000" to "1111". Namely, the mask information MASK may designate an operation for the processing element controller PE0 when it is "1000", and designate an operation for the processing element controller PE7 when it is "1111".

Referring to FIGS. 8, 10A and 10B, in the processing operation, the processing element controller 20 may generate the input select signal inc, the register control signal regc or the output select signal outc based on the first operand position information SRC1, the second operand position information SRC2 and the third operand position information SRC3, generate the processing element execution control signal pec based on the operator information OPE, and generate the register control signal regc and the output select signal outc based on the destination position information DST.

FIG. 11 shows configuration information stored in a configuration information storage area of an instruction storage according to an example embodiment. The configuration information may include processing element enable information PEEN, reset information RESET and program count information PCNT.

Referring to FIG. 11, the processing element enable information PEEN may be information enabling processing operations of processing element controllers PE0 to PE7, the reset information RESET may be information resetting the processing element controllers PE1 to PE7, and the program count information PCNT may be information indicating the value of an index of an instruction being currently executed.

Figures 12, 13:
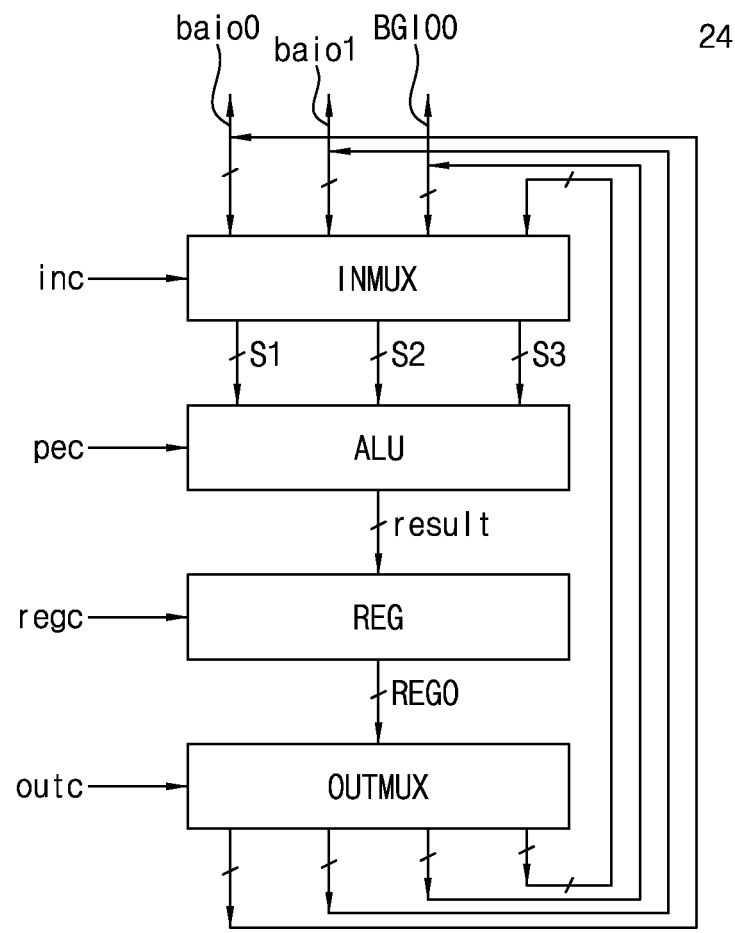
FIG. 12 is a block diagram showing a configuration of a processing element processor according to an example embodiment.
FIG. 13 is a view showing a structure of a register according to an example embodiment.

FIG. 12 is a block diagram showing the configuration of a processing element processor according to an example embodiment. A processing element processor 24 may include an input selector INMUX, a calculator ALU, a register REG, and an output selector OUTMUX.

A description will hereinafter be given of the function of each of the blocks shown in FIG. 12.

The input selector INMUX may select at least two of data transmitted through bank input/output line groups baio0 and baio1, data transmitted through a global input/output line group BGIO0, or register output data REG0 in response to an input select signal inc, and generate at least two of a first operand S1, a second operand S2 or a third operand S3.

The calculator ALU may perform a processing operation on at least two of the first operand S1, the second operand S2 or the third operand S3 in response to a processing element execution control signal pec.

The register REG may store processing operation result data in response to a register control signal regc and generate the stored processing operation result data as a register output signal REG0.

The output selector OUTMUX may output the register output signal REG0 to at least one of the bank input/output line groups baio0 and baio1, the global input/output line group BGIO0 or the input selector INMUX in response to an output select signal outc.

FIG. 13 is a view showing the structure of a register according to an example embodiment. A register REG may include x storage areas REG0 to REGx.

Referring to FIGS. 12 and 13, the register REG may store processing operation result data result in a selected one of the x storage areas REG0 to REGx or generate register output data reg from the selected storage area, in response to the register control signal regc.

FIGS. 14A and 14B show processing command truth tables of an HBM according to an example embodiment, in which a command & address ca may be a command & row address or a command & column address.

Referring to FIG. 14A, when the command & address ca is a command & row address and a clock enable signal CKE applied through a clock enable signal terminal CKE may be "high (H)" in level for two clock cycles of a clock signal applied through a clock signal terminal CK (at a first rising edge, a first falling edge, a second rising edge and a second falling edge of the clock signal), a processing element active command PEACT may be generated by decoding different signals applied to two R0 and R1 of i row address terminals R0 to Ri at the first rising edge of the clock signal. A bank address and a row address may be applied through the other terminals at the first rising edge of the clock signal and through the terminals R0 to Ri at the first falling edge, second rising edge and second falling edge of the clock signal.

Referring to FIG. 14B, when the command & address ca is a command & column address and the clock enable signal CKE may be "high (H)" in level for one clock cycle of the clock signal (at a rising edge and a falling edge of the clock signal), a processing element write command PEWR, a processing element read command PERD and a processing element read/write command PERW may be generated by decoding different signals applied to four C0 to C3 of j column address terminals C0 to Cj. A bank address and a column address may be applied through the other terminals at the rising edge of the clock signal and through the terminals C0 to Cj at the falling edge of the clock signal.

FIG. 15 is a table showing banks and/or processing element controllers designated by a bank address applied together with a processing command according to an example embodiment.

Referring to FIG. 15, when a command & address ca is a processing command, a 4-bit bank address applied together with the processing command may be used to select banks BA0 to BA15 and processing element controllers PE0 to PE7. For example, the processing element controllers PE0 to PE7 may be designated to operate, respectively, when the bank address is "0000", "0010", "0100", "0110", "1000", "1010", "1100" and "1110", the even-numbered banks BA0, BA2, BA4, BA6, BA8, BA10, BA12 and BA14 and the processing element controllers PE0 to PE7 may be designated to operate when the bank address is "0001", the odd-numbered banks BA1, BA3, BA5, BA7, BA9, BA11, BA13 and BA15 and the processing element controllers PE0 to PE7 may be designated to operate when the bank address is "0011", and the banks BA0 to BA15 and the processing element controllers PE0 to PE7 may be designated to operate when the bank address is "1111".

Referring to FIGS. 7, 8, 10A, 14A, 14B and 15, in the case where the bank address ba is "0001", the processing element controller 20 may generate the bank control signals bacon0 and bacon1, and the processing element input/output gating control signals pegc0 and pegc1 when the first operand position information SRC1 designates the input/output sense amplifier IOSA based on the operator information OPE of the instruction stored in the instruction storage 22 under the condition that the command signal com is the processing element read command PERD or the processing element read/write command PERW. The bank controller BANKC of the bank BA0 may be enabled in response to the bank control signal bacon0, and the processing element input/output gating unit PEIOG0 of the bank BA0 may be turned off in response to the processing element input/output gating control signal pegc0. As a result, data output through the bank input/output line group baio0 may be input to the processing element processor 24, not transmitted to the global input/output line group BGIO0. The bank controller BANKC of the bank BA1 may be disabled in response to the bank control signal bacon1.

Referring to FIGS. 7, 8, 10A, 14A, 14B and 15, in the case where the bank address ba is "0001", the processing element controller 20 may generate the bank control signals bacon0 and bacon1, and the processing element input/output gating control signals pegc0 and pegc1 when the second operand position information SRC2 designates the global input/output line group BGIO based on the operator information OPE of the instruction stored in the instruction storage 22 under the condition that the command signal com is the processing element write command PEWR or the processing element read/write command PERW. The bank controller BANKC of the bank BA0 may be enabled in response to the bank control signal bacon0 and the processing element input/output gating unit PEIOG0 of the bank BA0 may be turned off in response to the processing element input/output gating control signal pegc0. As a result, data transmitted to the global input/output line group BGIO0 may be input to the processing element processor 24, not transmitted to the bank input/output line group baio0. The bank controller BANKC of the bank BA1 may be disabled in response to the bank control signal bacon1.

For example, when the command signal com is the processing element read command PERD, a processing element read operation may be performed in which data is input from the bank input/output line group baio0 or baio1 of at least one processing element bank group (for example, PEBG0) to the processing element processor 24 of a processing element bank group (for example, PEBG0). When the command signal com is the processing element write command PEWR, a processing element write operation may be performed in which data is transmitted from the bank input/output line group baio0 or baio1 of at least one processing element bank group (for example, PEBG7) to the global input/output line group BGIO3 and input to the processing element processor 24 of a processing element bank group (for example, PEBG0). When the command signal com is the processing element read/write command PERW, the processing element read operation and the processing element write operation may be simultaneously performed.

Figures 16, 17:
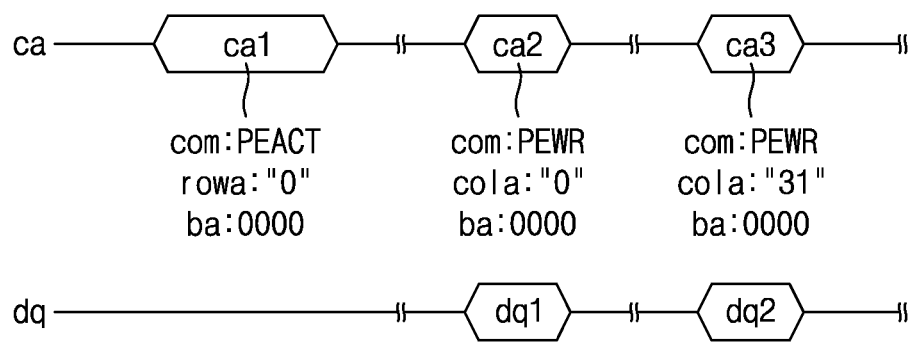

FIG. 16 is a timing diagram illustrating a processing setting operation of an HBM according to an example embodiment.

Referring to FIG. 16, when a command signal com in a command & row address ca1 is a processing element active command PEACT, a row address rowa is a specific row address (namely, a row address whose bits are all "0") designating the instruction storage 22 shown in FIG. 9 and a bank address ba is "0000" in the table of FIG. 15 designating the processing element controller PE0, the processing element controller PE0 may perform the processing setting operation.

Next, when a command signal com in a command & column address ca2 is a processing element write command PEWR and a column address cola is a column address "0" whose bits are all "0", designating the storage area INSTQ0 shown in FIG. 9, the processing element controller 20 shown in FIG. 8 may generate the instruction input control signal insic, and the instruction storage 22 shown in FIG. 8 may store data dq1 applied through the global input/output line group BGIO0 as an instruction in the storage area INSTQ0 shown in FIG. 9 in response to the instruction input control signal insic.

Next, when a command signal com in a command & column address ca3 is a processing element write command PEWR and a column address cola is a column address "31" whose bits other than a least significant bit are all "1", designating the configuration information storage area CONFG shown in FIG. 9, the instruction storage 22 shown in FIG. 8 may store data dq2 applied through the global input/output line group BGIO0 as configuration information in the configuration information storage area CONFG shown in FIG. 9 in response to the instruction input control signal insic.

Although the processing element controller PE0 has been described to perform the above processing setting operation, the other processing element controllers PE1 to PE7 may store the same or different instructions by repeatedly performing the above processing setting operation with the bank address ba being changed.

FIGS. 17 to 20 are views illustrating a processing operation of an HBM according to an example embodiment.

FIG. 17 shows that a 7×1 matrix C is obtained by performing a multiplication operation of a 7×16 matrix A and a 16×1 matrix B.

Figure 18:
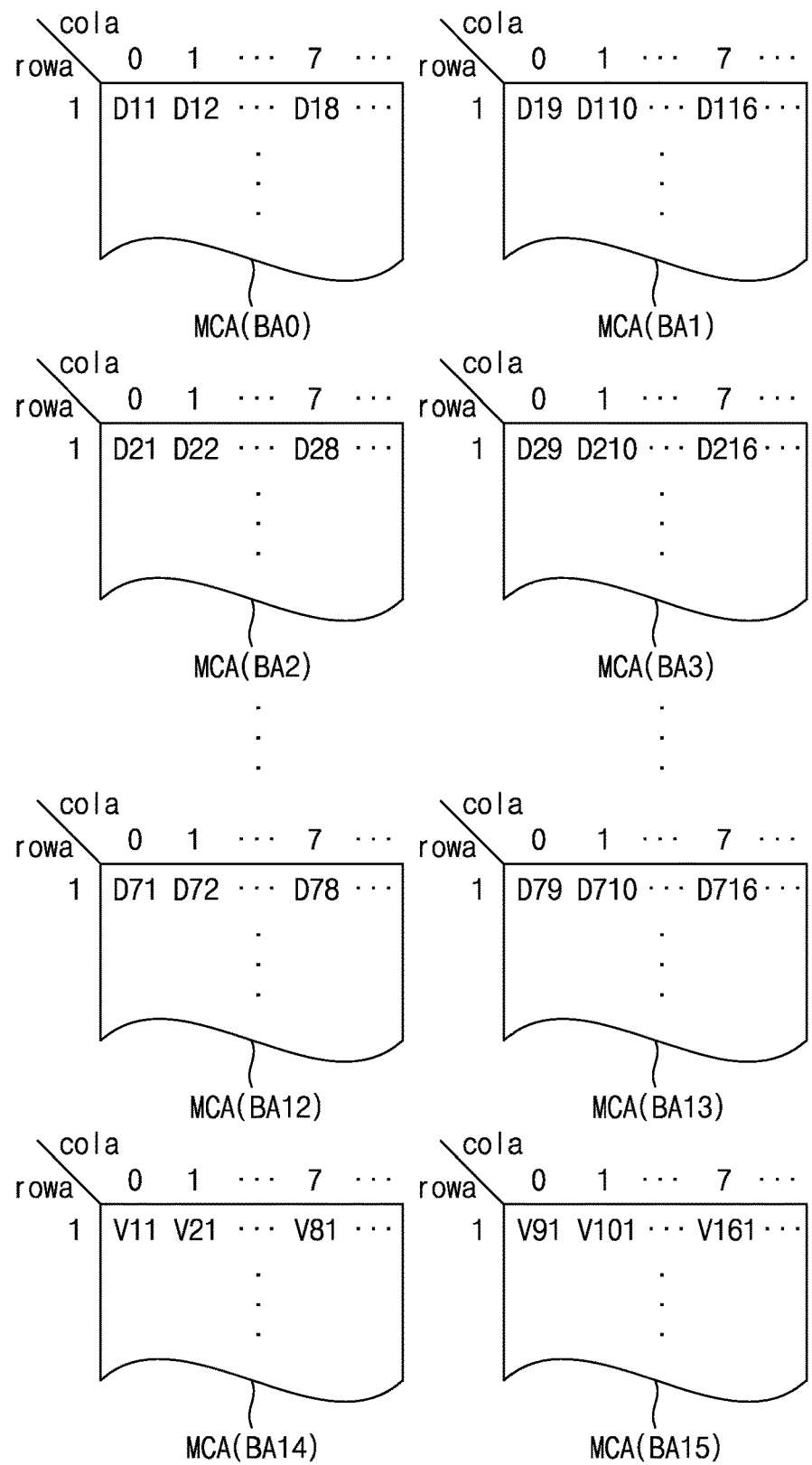

Referring to FIGS. 17 and 18, for the multiplication operation of the 7×16 matrix A and the 16×1 matrix B, eight data D11 to D18 of a first row of the 7×16 matrix A may be stored in a memory cell array MCA of a bank BA0 in response to a bank address ba of "0000", a row address rowa of "1" and a column address cola of "0", and the remaining eight data D19 to D116 of the first row may be stored in a memory cell array MCA of a bank BA1 in response to a bank address ba of "0001", the same row address rowa and the same column address cola. In this manner, sixteen data D21 to D216 of a second row of the 7×16 matrix A may be dividedly stored in banks BA2 and BA3, and sixteen data of each of third to seventh rows of the 7×16 matrix A may be dividedly stored in corresponding ones of banks BA4 and BA5, . . . , and BA12 and BA13. Likewise, eight data V11 to V81 of the 16×1 matrix B may be stored in a memory cell array MCA of a bank BA14 in response to a bank address ba of "1110", the same row address rowa and the same column address cola, and the remaining eight data V91 to V161 of the 16×1 matrix B may be stored in a memory cell array MCA of a bank BA15 in response to a bank address ba of "1111", the same row address rowa and the same column address cola.

FIGS. 19A and 19B are tables showing instructions which are stored in the instruction storage 22 of the processing element controller PE7 and the instruction storages 22 of the processing element controllers PE0 to PE6 by performing the processing setting operation shown in FIG. 16 to perform the multiplication operation shown in FIG. 17 with respect to the data stored in the banks BA0 to BA15 shown in FIG. 18.

Referring to FIGS. 19A and 19B, a movement operator MOV may instruct a movement operation of moving data of a first operand position IOSA or REG0 to a destination position BGIO. A multiplication-accumulation operator MAC may instruct a multiplication-accumulation operation of adding result data obtained by multiplying the data of the first operand position IOSA and data of a second operand position BGIO, and data of a third operand position REG0, and outputting the addition result data to a destination position REG0. A jump operator JUMP may instruct a jump operation of jumping to a destination position INDEX0 (the value 0 of index information of an instruction) to operate repeatedly by the number of times CNT (1) described in first operand position information. In addition, a NOP operator NOP may instruct no operation. Referring to FIG. 12, mask information MASK may designate the processing element controllers PE0 to PE7 to operate.

Figure 20:
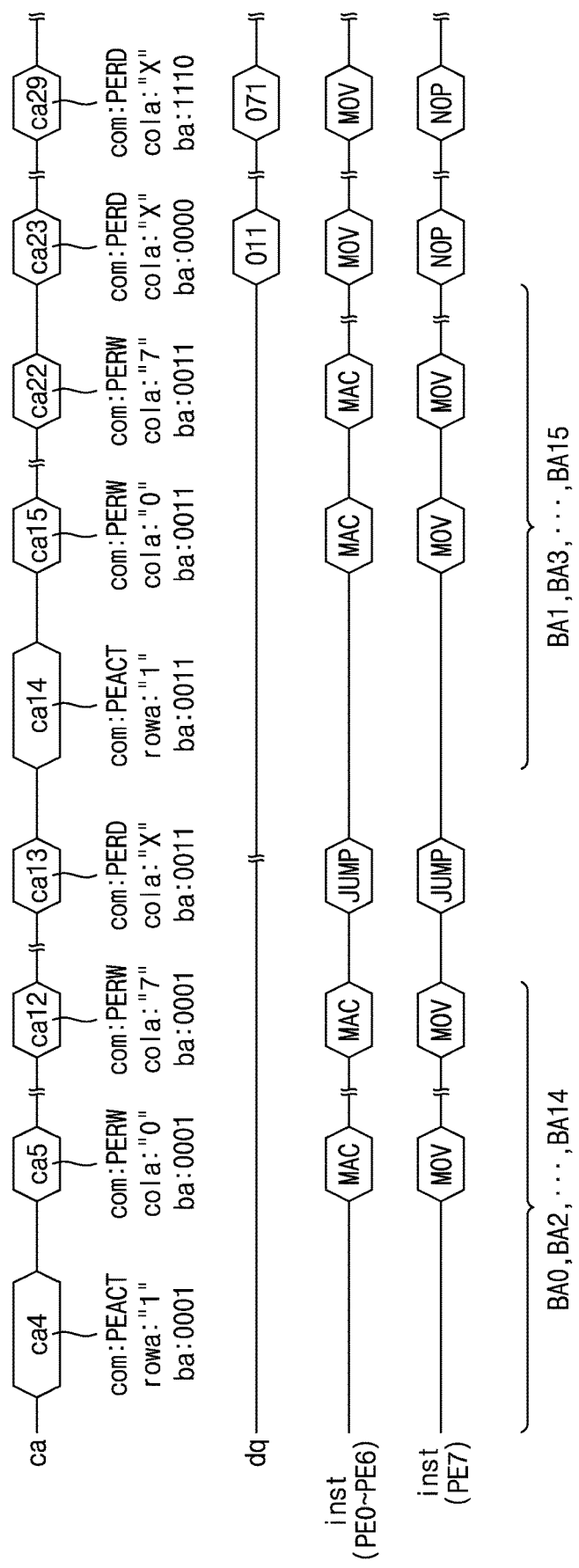

FIG. 20 is a timing diagram illustrating an operation of executing the instructions shown in FIGS. 19A and 19B in response to a command & address ca.

Referring to FIGS. 8, 12, 15 and 17 to 20, when a command signal com in a command & address ca4 is a processing element active command PEACT, a row address rowa is "1" and a bank address ba is "0001", memory cells of the memory cell arrays MCA of the even-numbered banks BA0, BA2, . . . , and BA14, corresponding to the row address rowa of "1", may be selected. In addition, the processing element controllers PE0 to PE7 may be selected.

Next, when a command signal com in a command & address ca5 is a processing element read/write command PERW, a column address cola is "0" and a bank address ba is "0001", memory cells of the memory cell arrays MCA of the even-numbered banks BA0, BA2, . . . , and BA14, corresponding to the row address rowa of "1" and the column address cola of "0", may be selected. The processing element controller PE7 may execute a movement operation MOV in the instruction storage 22 corresponding to an index 0 in response to the processing element read/write command PERW to transmit the data V11 stored in the bank BA14 to the global input/output line group BGIO3. Each of the processing element controllers PE0 to PE6 may execute a multiplication-accumulation operation MAC based on an instruction in the instruction storage 22 corresponding to the index 0 to add result data obtained by multiplying each of the data D11 to D18~D71 to D78 stored in a corresponding one of the even-numbered banks BA0, BA2, . . . , and BA12 and the data V11 stored in the even-numbered bank BA14, and data stored in the storage area REG0 of the register REG, to generate processing operation result data result and store the processing operation result data result in the storage area REG0 of the register REG. In this manner, until a command & address ca13 is applied, when a processing element read/write command PERW is applied as a command signal, a bank address ba of "0001" is applied and a column address cola which of "1" to "7" is applied, processing operation result data result may be generated by accumulating result data obtained by multiplying each of the data D11 to D18~D71 to D78 stored in the even-numbered banks BA0, BA2, . . . , and BA12 and each of the data V21 to V81 stored in the even-numbered bank BA14, and the data stored in the storage area REG0 of the register REG, and then stored in the storage area REG0 of the register REG. That is, processing operation result data of ((D11× V11)+ . . . +(D18×V81)) may be stored in the storage area REG0 of the register REG of the processing element controller PE0. Processing operation result data for the eight data of each of the second to seventh rows of the matrix A in FIG. 17 and the eight data of the first to eighth rows of the matrix B in FIG. 17 may be stored in the storage area REG0 of the register REG of a corresponding one of the processing element controllers PE1 to PE6.

Next, when a command signal com in a command & address ca13 is a processing element read command PERD, a column address cola is "X (don't care)" and a bank address ba is "0011" (or "0001" or "1111"), the processing element controllers PE0 to PE7 may operate. Each of the processing element controllers PE0 to PE7 may jump to a destination position INDEX0 (the value 0 of index information of an instruction) based on a jump operator JUMP to operate repeatedly by the number of times CNT (1) described in first operand position information.

Next, until command & addresses ca14 to ca22 are applied, the same command signals com, the same row addresses rowa and the same column addresses cola as those when the command & addresses ca4 to ca12 are applied may be applied, with the exception of bank addresses ba changed to "0011".

As a result, in response to the row addresses rows of "1" and the column addresses cola of "0" to "7" of the memory cell arrays MCA of the odd-numbered banks BA1, BA3, . . . , and BA15, processing operation result data result may be generated by accumulating result data obtained by multiplying each of the data D19 to D116~D79 to D716 stored in the odd-numbered banks BA1, BA3, . . . , and BA13 and each of the data V91 to V161 stored in the odd-numbered bank BA15, and the data stored in the storage area REG0 of the register REG, and then stored in the storage area REG0 of the register REG.

Accordingly, processing operation result data 011 of ((D11×V11)+ . . . +(D116×V161)) may be stored in the storage area REG0 of the register REG of the processing element controller PE0. Processing operation result data 021, 031, . . . , and 071 may be stored in the storage areas REG0 of the registers REG of the processing element controllers PE1 to PE6, respectively. Namely, the processing operation may be completed.

Next, when a command signal com in a command & address ca23 is a processing element read command PERD, a bank address ba is "0000" and a column address cola is "X", the processing element controller PE0 may be selected in response to the bank address ba. The processing element controller PE0 may execute a movement operation MOV to output the processing operation result data 011 stored in the storage area REG0 of the register REG through the global input/output line group BGIO0 and the data bus DBUS1. The processing element controllers PE1 to PE6 may be sequentially selected in response to the bank address ba to sequentially output the processing operation result data 021 to 071.

FIG. 21 is a view showing the configurations of bank groups of a pseudo-memory channel according to an example embodiment. Bank groups BG0 to BG3 may be processing element bank groups PEBG0 to PEBG4, respectively. Each of the bank groups BG0 to BG3 may include four banks.

Referring to FIG. 21, the processing element bank group PEBG0 may include four banks BA0 to BA3 and a processing element controller PE0, the processing element bank group PEBG1 may include four banks BA4 to BA7 and a processing element controller PE1, the processing element bank group PEBG2 may include four banks BA8 to BA11 and a processing element controller PE2, and the processing element bank group PEBG3 may include four banks BA12 to BA15 and a processing element controller PE3.

Figure 22:
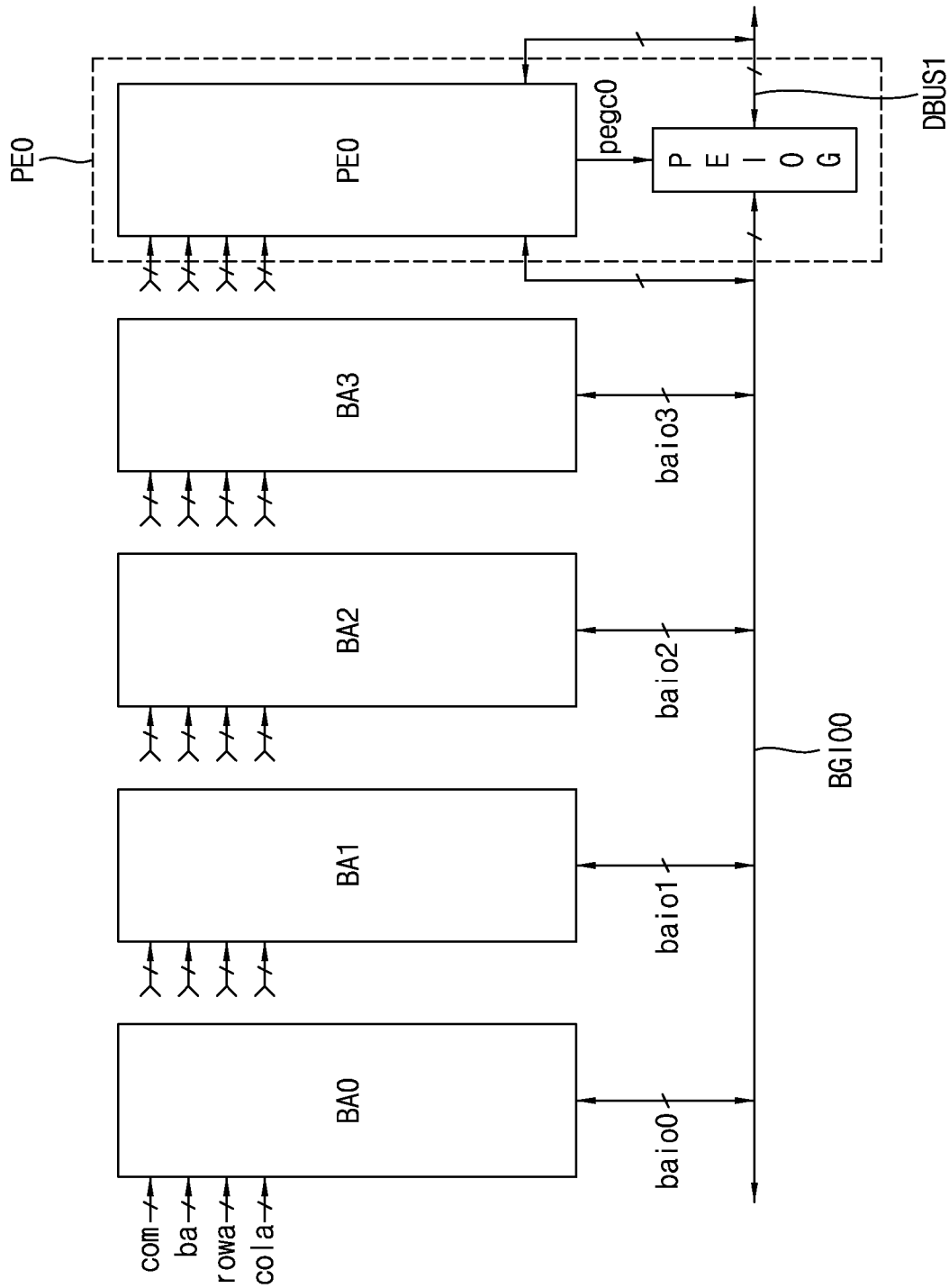
FIG. 22 is a block diagram showing a configuration of a processing element bank group according to an example embodiment.

FIG. 22 is a block diagram showing the configuration of a processing element bank group, more particularly the processing element bank group PEBG0 among the processing element bank groups PEBG0 to PEBG4 shown in FIG. 21, according to an example embodiment.

Referring to FIG. 22, each of the banks BA0 to BA3 of the processing element bank group PEBG0 may be the same in configuration as the bank BA0 shown in FIG. 7. Bank input/output line groups baio0 to baio3 may be connected in common to a global input/output line group BGIO0. A processing element input/output gating unit PEIOG may control a connection between the global input/output line group BGIO0 and a data bus DBUS1 in response to a processing element input/output gating control signal pegc0. The processing element controller PE0 may perform the same operation as that of the above-stated processing element controller PE0, with the exception that it is connected to the global input/output line group BGIO0 and the data bus DBUS1. That is, the processing element controller PE0 may perform a processing operation on data transmitted through the global input/output line group BGIO0 and data transmitted through the data bus DBUS1.

A detailed description of the configurations shown in FIGS. 21 and 22 will be readily understood from the above description of FIGS. 1 to 20.

As is apparent from the above description, a high bandwidth memory according to example embodiments may internally perform different processing operations simultaneously using data stored therein. Further, a system having the high bandwidth memory may perform a processing operation without data transmission between the high bandwidth memory and a control unit. Therefore, it may be possible to improve a processing operation speed and reduce power consumption.

At least one of the control unit, buffer die, memory dies, controllers, processors, multiplexers, calculators, registers, selectors, drivers, decoders, processing elements, gating units, amplifiers or other element represented by a block as illustrated in FIGS. 1-8, 12, 21 and 22 may be embodied as various numbers of hardware, software and/or firmware structures that execute respective functions described above, according to an exemplary embodiment. For example, at least one of the control unit, buffer die, memory dies, controllers, processors, multiplexers, calculators, registers, selectors, drivers, decoders, processing elements, gating units, amplifiers or other element may use a direct circuit structure, such as a memory, a processor, a logic circuit, a look-up table, etc. that may execute the respective functions through controls of one or more microprocessors or other control apparatuses. Also, at least one of the control unit, buffer die, memory dies, controllers, processors, multiplexers, calculators, registers, selectors, drivers, decoders, processing elements, gating units, amplifiers or other element may be specifically embodied by a module, a program, or a part of code, which contains one or more executable instructions for performing specified logic functions, and executed by one or more microprocessors or other control apparatuses. Also, at least one of the control unit, buffer die, memory dies, controllers, processors, multiplexers, calculators, registers, selectors, drivers, decoders, processing elements, gating units, amplifiers or other element may further include or may be implemented by a processor such as a central processing unit (CPU) that performs the respective functions, a microprocessor, or the like. Two or more of the control unit, buffer die, memory dies, controllers, processors, multiplexers, calculators, registers, selectors, drivers, decoders, processing elements, gating units, amplifiers or other element may be combined into one single component, element, module or unit which performs all operations or functions of the combined two or more of control unit, buffer die, memory dies, controllers, processors, multiplexers, calculators, registers, selectors, drivers, decoders, processing elements, gating units, amplifiers or other element. Also, at least part of functions of at least one of the control unit, buffer die, memory dies, controllers, processors, multiplexers, calculators, registers, selectors, drivers, decoders, processing elements, gating units, amplifiers or other element may be performed by another of these components. Further, although a bus is not illustrated in each of the above block diagrams, communication between the components may be performed through the bus. Functional aspects of the above example embodiments may be implemented in algorithms that execute on one or more processors. Furthermore, the control unit, buffer die, memory dies, controllers, processors, multiplexers, calculators, registers, selectors, drivers, decoders, processing elements, gating units, amplifiers or other element represented by a block or processing steps may employ any number of related art techniques for electronics configuration, signal processing and/or control, data processing and the like.

While the disclosure has been particularly shown and described with reference to example embodiments thereof, it will be apparent to those skilled in the art that various changes in form and detail may be made without departing from the spirit and essential characteristics of the disclosure. The above example embodiments are therefore to be construed in all aspects as illustrative and not restrictive.

What is claimed is:

1. A system comprising:
   a high bandwidth memory comprising a buffer die, and a plurality of memory dies stacked on the buffer die; and
   a controller configured to transmit a command & address to the buffer die and receive output data from the buffer die,
   wherein each of the plurality of memory dies comprises at least one first processing element bank group and at least one second processing element bank group,
   wherein the at least one first processing element bank group comprises:
   one or more first banks connected to one or more first bank input/output line groups; and
   a first processing element controller connected to the one or more first bank input/output line groups and a first global input/output line group, wherein the first processing element controller is configured to perform a first processing operation on first data output from one of the one or more first bank input/output line groups and second data transmitted through the first global input/output line group based on a first instruction that is generated based on a first processing command,
   wherein the at least one second processing element bank group comprises:
   one or more second banks connected to one or more second bank input/output line groups; and
   a second processing element controller connected to the one or more second bank input/output line groups and a second global input/output line group, wherein the second processing element controller is configured to perform a second processing operation of retrieving the second data from one of the one or more second banks and transmitting the second data to the second global input/output line group based on a second instruction different from the first instruction that is generated based on the first processing command, and wherein the first global input/output line group and the second global input/output line group are connected in common to a data bus.

2. The system according to claim 1, wherein each of the plurality of memory dies comprises at least two memory channels, wherein each of the at least two memory channels comprises at least two pseudo-memory channels, wherein each of the at least two pseudo-memory channels comprises one from among the at least one first processing element bank group and one from among the at least one second processing element bank group, and wherein each of the at least two pseudo-memory channels comprises a command & address generator configured to receive the command & address from the buffer die and generate a command signal, a bank address, a row address and a column address.

3. The system according to claim 2, wherein each of the one or more first banks and the one or more second banks comprises:

a row decoder configured to generate a plurality of word line select signals based on the row address;

a column decoder configured to generate a plurality of column select signals based on the column address;

a memory cell array comprising a plurality of memory cells, the plurality of memory cells being partially selected based on the plurality of word line select signals and the plurality of column select signals;

an input/output sense amplifier configured to amplify and output data output from the memory cell array;

a write driver configured to drive input data and output the driven input data to the memory cell array; and a global input/output gating unit configured to control connections between the input/output sense amplifier and the write driver and a corresponding one of the one or more first bank input/output line groups or the one or more second bank input/output line groups.

4. The system according to claim 1, wherein the first processing element controller comprises:

a first processing element unit configured to generate a first processing element input/output gating control signal based on a first bank address applied together with the first processing command and perform the first processing operation; and one or more first processing element input/output gating units configured to isolate connections between the one or more first bank input/output line groups and the first global input/output line group based on the first processing element input/output gating control signal, and wherein the second processing element controller comprises:

a second processing element unit configured to generate a second processing element input/output gating control signal based on a second bank address applied together with the first processing command and perform the second processing operation; and one or more second processing element input/output gating units configured to connect connections between the one or more second bank input/output line groups and the second global input/output line group based on the second processing element input/output gating control signal.

5. The system according to claim 4, wherein, when a bank address applied together with the first processing command designates one of the one or more first banks, one of the one or more second banks, the first processing element controller and the second processing element controller, the one of the one or more first banks and the one of the one or more second banks simultaneously generate the first data and the second data based on a common row address and a common column address.

6. The system according to claim 4, wherein each of the first processing element unit and the second processing element unit comprises an instruction storage configured to store a plurality of instructions comprising the first instruction or the second instruction, wherein each of the first processing element unit and the second processing element unit comprises a processing element controller configured to, based on the first processing command, generate a first processing element control signal based on the first instruction or generate a second processing element control signal based on the second instruction, and wherein each of the first processing element unit and the second processing element unit comprises a processing element processor configured to perform the first processing operation based on the first processing element control signal or perform the second processing operation based on the second processing element control signal.

7. The system according to claim 6, wherein the instruction storage is configured to store the first instruction or the second instruction based on a second processing command in a processing setting operation, and output the first instruction or the second instruction based on the first processing command in a processing operation, wherein each of the first instruction and the second instruction comprises index information, operator information, destination position information, at least one operand position information, and mask information, and wherein the mask information designates an operation of at least one among the at least one first processing element bank group or the at least one second processing element bank group.

8. The system according to claim 7, wherein each of the first processing element unit and the second processing element unit is further configured to generate an input select signal based on first operand position information and second operand position information, generate a processing element execution control signal based on the operator information and generate a register control signal and an output select signal based on the destination position information.

9. The system according to claim 8, wherein the processing element processor comprises:

an input selector configured to select the first data, the second data and/or register output data based on the input select signal;

a calculator configured to perform the first processing operation based on the processing element execution control signal and output processing operation result data;

a register configured to store the processing operation result data based on the register control signal; and an output selector configured to transmit the processing operation result data to one of the one or more first bank input/output line groups, the first global input/output line group or the input selector based on the output select signal.

10. The system according to claim 9, wherein the operator information in the first instruction comprises a multiplication-accumulation operator, a multiplication operator or an addition/subtraction operator,
wherein, based on the operator information in the first instruction being the multiplication operator or the addition/subtraction operator, the input selector selects the first data and the second data and the calculator performs, as the first processing operation, a multiplication operation or an addition/subtraction operation on the first data and the second data,
wherein the first instruction further comprises third operand information,
wherein, based on the operator information in the first instruction being the multiplication-accumulation operator, the input selector selects the first data, the second data and the register output data and the calculator performs, as the first processing operation, a multiplication-accumulation operation of adding the register output data to result data obtained by multiplying the first data and the second data, and
wherein the operator information in the second instruction is a movement operator.

11. A system comprising:
a high bandwidth memory comprising a buffer die, and a plurality of memory dies stacked on the buffer die; and
a controller configured to transmit a command & address to the buffer die and receive output data from the buffer die,
wherein each of the plurality of memory dies comprises at least one first processing element bank group and at least one second processing element bank group,
wherein the at least one first processing element bank group comprises:
one or more first banks connected to one or more first bank input/output line groups connected to a first global input/output line group; and
a first processing element controller connected to the first global input/output line group and a data bus, wherein the first processing element controller is configured to, based on a first instruction received based on a first processing command, receive first data output through one of the one or more first bank input/output line groups, receive second data through the data bus and perform a first processing operation on the first data and the second data, and
wherein the at least one second processing element bank group comprises:
one or more second banks connected to one or more second bank input/output line groups connected to a second global input/output line group; and
a second processing element controller connected to the second global input/output line group and the data bus, wherein the second processing element controller is configured to perform a second processing operation of obtaining the second data from one of the one or more second bank input/output line groups and transmitting the second data to the data bus through the second global input/output line group based on a second instruction different from the first instruction, the second instruction being received based on the first processing command.

12. The system according to claim 11, wherein each of the plurality of memory dies comprises at least two memory channels,
wherein each of the at least two memory channels comprises at least two pseudo-memory channels,
wherein each of the at least two pseudo-memory channels comprises one from among the at least one first processing element bank group and one from among the at least one second processing element bank group, and
wherein each of the at least two pseudo-memory channels comprises a command & address generator configured to receive a command & address applied from the buffer die and generate a command signal, a bank address, a row address and a column address.

13. The system according to claim 12, wherein each of the one or more first banks and the one or more second banks comprises:
a row decoder configured to generate a plurality of word line select signals based on the row address;
a column decoder configured to generate a plurality of column select signals based on the column address;
a memory cell array comprising a plurality of memory cells, the plurality of memory cells being partially selected based on the plurality of word line select signals and the plurality of column select signals;
an input/output sense amplifier configured to amplify and output data output from the memory cell array;
a write driver configured to drive input data and output the driven data to the memory cell array; and
a global input/output gating unit configured to control connections between the input/output sense amplifier and the write driver and a corresponding one of the one or more first bank input/output line groups or the one or more second bank input/output line groups.

14. The system according to claim 11, wherein the first processing element controller comprises:
a first processing element unit configured to generate a first processing element input/output gating control signal based on a first bank address applied together with the first processing command and perform the first processing operation; and
one or more first processing element input/output gating units configured to cut off a connection between the first global input/output line group and the data bus in response to the first processing element input/output gating control signal, and
wherein the second processing element controller comprises:
a second processing element unit configured to generate a second processing element input/output gating control signal based on a second bank address applied together with the first processing command and perform the second processing operation; and
one or more second processing element input/output gating units configured to make a connection between the second global input/output line group and the data bus in response to the second processing element input/output gating control signal.

15. The system according to claim 14, wherein, when a bank address applied together with the first processing command designates one of the one or more first banks, one of the one or more second banks, the first processing element controller and the second processing element controller, the one of the one or more first banks and the one of the one or more second banks simultaneously generate the first data and the second data based on a common row address and based on a common column address.

16. The system according to claim 14, wherein each of the first processing element unit and the second processing element unit comprises an instruction storage configured to store a plurality of instructions comprising the first instruction or the second instruction,
- wherein each of the first processing element unit and the second processing element unit comprises a processing element controller configured to, based on the first processing command, generate a first processing element control signal based on the first instruction or generate a second processing element control signal based on the second instruction, and
- wherein each of the first processing element unit and the second processing element unit comprises a processing element processor configured to perform the first processing operation based on the first processing element control signal or perform the second processing operation based on the second processing element control signal.

17. The system according to claim 16, wherein the instruction storage is configured to store the first instruction or the second instruction based on a second processing command in a processing setting operation, and output the first instruction or the second instruction based on the first processing command in a processing operation,
- wherein each of the first instruction and the second instruction comprises index information, operator information, destination position information, at least one operand position information, and mask information, and
- wherein the mask information designates an operation of at least one among the at least one first processing element bank group or the at least one second processing element bank group.

18. The system according to claim 17, wherein each of the first processing element unit and the second processing element unit is further configured to generate an input select signal based on first operand position information and second operand position information, generate a processing element execution control signal based on the operator information and generate a register control signal and an output select signal based on the destination position information.

19. The system according to claim 18, wherein the processing element processor comprises:
- an input selector configured to select the first data, the second data and/or register output data based on the input select signal;
- a calculator configured to perform the first processing operation based on the processing element execution control signal and output processing operation result data;
- a register configured to store the processing operation result data based on the register control signal; and
- an output selector configured to transmit the processing operation result data to one of the one or more first bank input/output line groups, the data bus or the input selector based on the output select signal.

20. The system according to claim 19, wherein the operator information in the first instruction comprises a multiplication-accumulation operator, a multiplication operator or an addition/subtraction operator,
- wherein, based on the operator information in the first instruction being the multiplication operator or the addition/subtraction operator, the input selector selects the first data and the second data, and the calculator performs, as the first processing operation, a multiplication operation or an addition/subtraction operation on the first data and the second data,
- wherein the first instruction further comprises third operand information,
- wherein, based on the operator information in the first instruction being the multiplication-accumulation operator, the input selector selects the first data, the second data and the register output data and the calculator performs, as the first processing operation, a multiplication-accumulation operation of adding the register output data to result data obtained by multiplying the first data and the second data, and
- wherein the operator information in the second instruction is a movement operator.

* * * * *